United States Patent
Fujiwara et al.

(10) Patent No.: US 9,631,296 B2
(45) Date of Patent: Apr. 25, 2017

(54) METHOD OF MANUFACTURING SILICON CARBIDE SUBSTRATE

(71) Applicant: Sumitomo Electric Industries, Ltd., Osaka-shi, Osaka (JP)

(72) Inventors: Shinsuke Fujiwara, Itami (JP); Taro Nishiguchi, Itami (JP); Tsutomu Hori, Itami (JP); Naoki Ooi, Itami (JP); Shunsaku Ueta, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 219 days.

(21) Appl. No.: 14/408,422

(22) PCT Filed: Jun. 11, 2013

(86) PCT No.: PCT/JP2013/066083
§ 371 (c)(1),
(2) Date: Dec. 16, 2014

(87) PCT Pub. No.: WO2014/017197
PCT Pub. Date: Jan. 30, 2014

(65) Prior Publication Data
US 2015/0225873 A1 Aug. 13, 2015

(30) Foreign Application Priority Data
Jul. 26, 2012 (JP) .................. 2012-165995

(51) Int. Cl.
*C30B 23/08* (2006.01)
*C30B 23/06* (2006.01)
(Continued)

(52) U.S. Cl.
CPC ............ *C30B 23/066* (2013.01); *C30B 23/00* (2013.01); *C30B 29/36* (2013.01);
(Continued)

(58) Field of Classification Search
CPC ......... C30B 23/08; C30B 23/02; C30B 23/06; C30B 29/36
See application file for complete search history.

(56) References Cited

U.S. PATENT DOCUMENTS

| 5,211,801 A | * 5/1993 | Stein ................. C30B 23/00 117/84 |
| 5,863,325 A | 1/1999 | Kanemoto et al. |

(Continued)

FOREIGN PATENT DOCUMENTS

| DE | 697 12 520 T2 | 1/2003 |
| JP | H09-48605 A | 2/1997 |

(Continued)

OTHER PUBLICATIONS

"Powder Technology Handbook", (Edited by Koichi IINOYA), Asakura Shoten, Mar. 5, 1965, pp. 380-382.

*Primary Examiner* — Robert M Kunemund
(74) *Attorney, Agent, or Firm* — Drinker Biddle & Reath LLP (57) ABSTRACT

A method of manufacturing a silicon carbide substrate has the following steps. A silicon carbide source material is partially sublimated. After partially sublimating the silicon carbide source material, a seed substrate having a main surface is placed in a growth container. By sublimating the remainder of the silicon carbide source material in the growth container, a silicon carbide crystal grows on the main surface of the seed substrate. In this way, an increase of dislocations in the main surface of the seed substrate can be suppressed, thereby providing a method of manufacturing a silicon carbide substrate having few dislocations.

5 Claims, 4 Drawing Sheets (51) Int. Cl.
*C30B 29/36* (2006.01)
*C30B 23/00* (2006.01)
*H01L 21/02* (2006.01)

(52) U.S. Cl.
CPC .. *H01L 21/02529* (2013.01); *H01L 21/02645* (2013.01); *H01L 21/02664* (2013.01)

(56) References Cited

U.S. PATENT DOCUMENTS

| | | | |
|---|---|---|---|
| 5,964,934 A * | 10/1999 | Englert | C04B 14/185 106/287.1 |
| 6,261,363 B1 | 7/2001 | Vodakov et al. | |
| 6,406,539 B1 * | 6/2002 | Shigeto | C04B 28/146 106/698 |
| 6,773,505 B2 * | 8/2004 | Kuhn | C30B 23/00 117/89 |
| 2007/0068449 A1 | 3/2007 | Seo et al. | |
| 2012/0183466 A1 | 7/2012 | Sasaki | |
| 2013/0266810 A1 | 10/2013 | Katou et al. | |

FOREIGN PATENT DOCUMENTS

| | | |
|---|---|---|
| JP | H11-79885 A | 3/1999 |
| JP | 2007-284306 A | 11/2007 |
| JP | 2009-173501 A | 8/2009 |
| JP | 2009-234802 A | 10/2009 |
| JP | 2011-102204 A | 5/2011 |
| JP | 2011-168425 A | 9/2011 |
| JP | 2011-230941 A | 11/2011 |
| JP | 2013-095632 A | 5/2013 |
| JP | 2013-103848 A | 5/2013 |
| TW | 364894 A | 7/1999 |
| WO | WO-2012/067011 A | 5/2012 |

\* cited by examiner

FIG.8 ent invention relates to a method of manufactur-
METHOD OF MANUFACTURING SILICON CARBIDE SUBSTRATE

TECHNICAL FIELD

The present invention relates to a method of manufacturing a silicon carbide substrate, more particularly, to a method of manufacturing a silicon carbide substrate having few dislocations.

BACKGROUND ART

In recent years, a silicon carbide substrate has begun to be adopted for manufacturing of a semiconductor device. Silicon carbide has a wider band gap than that of silicon. Hence, a semiconductor device using a silicon carbide substrate has advantages such as a high breakdown voltage, a low on-resistance and a less deteriorated property under a high temperature condition.

A silicon carbide single crystal can be manufactured by a sublimation-recrystallization method, for example. For example, Japanese Patent Laying-Open No. 2007-284306 (Patent Document 1) describes a method of manufacturing a silicon carbide single crystal with a specific surface area of a source material silicon carbide powder being set to be not less than 0.001 m$^2$/g and not more than 0.05 m$^2$/g. Japanese Patent Laying-Open No. 2009-234802 (Patent Document 2) describes a method of manufacturing a silicon carbide single crystal by performing a pretreatment to maintain, for a predetermined time, a crucible under a reduced-pressure atmosphere at a temperature equal to or more than a temperature at which the silicon carbide source material does not sublime and then sublimating the silicon carbide source material under an inert gas atmosphere.

CITATION LIST

Patent Document

PTD 1: Japanese Patent Laying-Open No. 2007-284306
PTD 2: Japanese Patent Laying-Open No. 2009-234802

SUMMARY OF INVENTION

Technical Problem

However, in manufacturing the silicon carbide crystal by each of the methods described above, it is impossible to sufficiently suppress an increase of dislocations in a main surface of a seed substrate and it is difficult to obtain a silicon carbide substrate having few dislocations.

The present invention has been made to solve the foregoing problem, and has its object to provide a method of manufacturing a silicon carbide substrate having few dislocations by suppressing an increase of dislocations in a main surface of a seed substrate.

Solution to Problem

The present inventors have diligently studied a reason for the increase of dislocations in the main surface of the seed substrate in the case of manufacturing a silicon carbide single crystal by the sublimation method and accordingly have conceived the present invention based on the following findings. In order to grow a high-quality silicon carbide single crystal by the sublimation method, it is important to control a sublimation gas. The sublimation gas can be produced by heating and sublimating a silicon carbide powder as a source material. Although composition and vapor pressure of the sublimation gas do not depend on a particle size of the silicon carbide source material powder in the ideal case, they depend on the particle size in the actual case. Therefore, it is important to optimize the particle size and/or specific surface area of the silicon carbide source material powder. However, even though the particle size and/or specific surface area of the silicon carbide source material powder are controlled, the silicon carbide source material powder is partially crushed to generate fine particles or a damaged layer is formed in the silicon carbide source material powder during handling of the silicon carbide source material powder. The existence of the fine powder and damaged layer causes an increase of dislocations in the silicon carbide crystal at an initial stage of the crystal growth.

As a result of examining a method of removing the fine powder in the silicon carbide source material powder, it has been conceived that it is effective to sublimate and accordingly remove the fine powder or the damaged layer before growing the silicon carbide crystal on the main surface of the seed substrate. A fine powder having a small particle size has a small radius of curvature in its form. Therefore, surface energy becomes large, so that it is likely to sublime. Even when the powder has a large particle size, the damaged layer in the surface is likely to sublime. In view of this, by partially sublimating the silicon carbide source material before placing the seed substrate in the growth container, the fine powder and damaged layer, which would have caused an increase of dislocations, can be preferentially removed.

Thus, a method of manufacturing a silicon carbide substrate in the present invention includes the following steps. A silicon carbide source material is partially sublimated. A seed substrate having a main surface is placed in a growth container after partially sublimating the silicon carbide source material. A silicon carbide crystal is grown on the main surface of the seed substrate by sublimating a remainder of the silicon carbide source material in the growth container.

According to the method of manufacturing the silicon carbide substrate in accordance with the present invention, the silicon carbide source material is partially sublimated and then the remainder of the silicon carbide source material is sublimated, thereby growing the silicon carbide single crystal on the main surface of the seed substrate. In this way, the silicon carbide single crystal can be grown on the main surface of the seed substrate after sublimating and removing preferentially the fine powder or damaged layer, which would have caused an increase of dislocations at the initial stage of the crystal growth. Moreover, since the seed substrate is placed in the growth container after partially sublimating the silicon carbide source material, the seed substrate can be prevented from being contaminated by the sublimated fine powder and damaged layer. As a result, a silicon carbide substrate having few dislocations can be obtained.

Preferably in the method of manufacturing the silicon carbide substrate, the step of growing the silicon carbide crystal is performed without providing a mechanical process to the remainder of the silicon carbide source material, after the step of partially sublimating the silicon carbide source material. Accordingly, the fine powder and damaged layer can be prevented from being generated in the remainder of the silicon carbide source material.

Preferably in the method of manufacturing the silicon carbide substrate, a value obtained by subtracting a second dislocation density just below the main surface of the seed substrate from a first dislocation density just above the main surface of the seed substrate is not more than $1\times10^3$ cm$^{-2}$. In this way, a silicon carbide substrate having few dislocations can be effectively obtained.

Preferably, the method of manufacturing the silicon carbide substrate further includes the step of reducing a silicon carbide fine powder in the silicon carbide source material before partially sublimating the silicon carbide source material. In this way, a silicon carbide substrate having few dislocations can be more effectively obtained.

Preferably in the method of manufacturing the silicon carbide substrate, the step of reducing the silicon carbide fine powder is performed by immersing the silicon carbide source material in a liquid and removing the silicon carbide fine powder floating on a surface of the liquid. In this way, with such a simple method, the silicon carbide fine powder can be removed from the silicon carbide source material.

Advantageous Effects of Invention

According to the present invention, the silicon carbide crystal having few dislocations can be obtained by suppressing the increase of dislocations in the main surface of the seed substrate.

DESCRIPTION OF EMBODIMENTS

The following describes embodiments of the present invention with reference to figures. It should be noted that in the below-mentioned figures, the same or corresponding portions are given the same reference characters and are not described repeatedly. Further, regarding crystallographical indications in the present specification, an individual orientation is represented by [ ], a group orientation is represented by < >, and an individual plane is represented by ( ) and a group plane is represented by { }. In addition, a negative index is supposed to be crystallographically indicated by putting "–" (bar) above a numeral, but is indicated by putting the negative sign before the numeral in the present specification. For description of an angle, a system in which an omnidirectional angle is 360° is employed.

Figure 3:
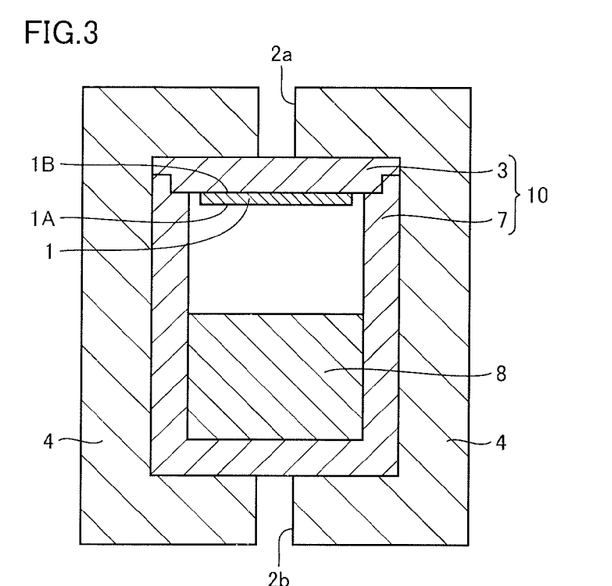
FIG. 3 is a schematic cross sectional view schematically showing a second step of the method of manufacturing the silicon carbide substrate in accordance with the embodiment of the present invention.

Referring to FIG. 3, a structure of an apparatus for manufacturing a silicon carbide substrate in accordance with the present embodiment will be described.

Referring to FIG. 3, the apparatus for manufacturing the silicon carbide substrate in accordance with the present embodiment mainly includes a growth container 10 and a heat insulator 4. Growth container 10 is a crucible made of, for example, purified graphite, and includes a seed substrate retaining portion 3 and a source material accommodating portion 7. Seed substrate retaining portion 3 retains a seed substrate made of single-crystal silicon carbide, for example. Source material accommodating portion 7 accommodates silicon carbide source material 8 made of polycrystal silicon carbide, for example.

Heat insulator 4 is made of, for example, felt and insulates growth container 10 from heat externally. Heat insulator 4 is formed to surround the external wall surface of growth container 10, for example. Heat insulator 4 is provided with a plurality of through holes 2a, 2b. Seed substrate retaining portion 3 has an upper surface, a part of which is exposed through a through hole 2a formed in heat insulator 4. On the other hand, source material accommodating portion 7 has a bottom surface, a part of which is exposed through a through hole 2b formed in heat insulator 4.

Referring to FIG. 1 to FIG. 5, the following describes a method of manufacturing the silicon carbide substrate in accordance with the present embodiment.

First, a seed substrate 1 made of, for example, a silicon carbide single crystal is prepared. Seed substrate 1 has a polytype of 4H, for example. Seed substrate 1 has a diameter of, for example, 6 inches, preferably, 4 inches (100 mm) or more. Seed substrate 1 has a main surface 1A corresponding to a (0001) C plane off by about 4°, for example. A threading dislocation density in main surface 1A of seed substrate 1 is about 1000 cm$^{-2}$, for example. Seed substrate 1 has its surfaces polished through CMP (Chemical Mechanical Polishing). Seed substrate 1 has a warpage of less than 10 μm, for example.

In the present embodiment, main surface 1A of seed substrate 1 is etched under a silicon gas atmosphere. Specifically, a crucible made of graphite for etching is placed in a heating furnace. After evacuating the heating furnace, the heating furnace is filled with argon (Ar) at about 70 kPa, for example. Seed substrate 1 is placed at an upper portion in the crucible for etching. In the crucible, silicon is placed and no silicon carbide source material powder is placed. It should be noted that the silicon placed in the crucible is high-purity silicon (9N), for example. The upper portion of the crucible for etching is maintained at about 1700° C. and the lower portion thereof is maintained at about 1600° C. for about 1 hour. Accordingly, main surface 1A of seed substrate 1 made of single-crystal silicon carbide is etched under the silicon gas atmosphere. It is etched by a thickness of not less than 0.2 μm and not more than 0.5 μm, for example. With this etching, a damaged layer (a layer including defects and dislocations) is removed from main surface 1A of seed substrate 1.

Next, a silicon carbide source material 8 is prepared. Silicon carbide source material 8 is formed of a polycrystal silicon carbide powder, for example. For silicon carbide source material 8, a high-purity α-silicon carbide powder can be used, for example. The silicon carbide powder has an average particle size of for example, about 100 μm and has a maximum particle size of about 200 μm. Further, the silicon carbide powder includes a silicon carbide fine powder of about 2 μm to 3 μm, for example. The fine powder in the present embodiment is, for example, a silicon carbide powder having a particle size of 30 μm or less, preferably, a silicon carbide powder having a particle size of 10 μm or less.

Next, the step of removing the fine powder in the silicon carbide source material is performed. Specifically, referring to FIG. 5, silicon carbide source material 8 is cleaned using a liquid 13. As liquid 13, hydrochloric acid having a concentration of 35% can be used, for example. Silicon carbide has a specific gravity larger than that of the hydrochloric acid and therefore basically sinks in the hydrochloric acid. However, fine powder 8a of silicon carbide floats on the liquid surface due to surface tension of the hydrochloric acid (liquid). By scooping only the floating fine powder 8a from the liquid surface, fine powder 8a is separated and removed from silicon carbide source material 8. In this way, silicon carbide fine powder 8a in silicon carbide source material 8 is reduced. It should be noted that the step of reducing fine powder 8a in silicon carbide source material 8 is preferably performed before the below-described silicon carbide source material partial sublimating step.

Figure 5:
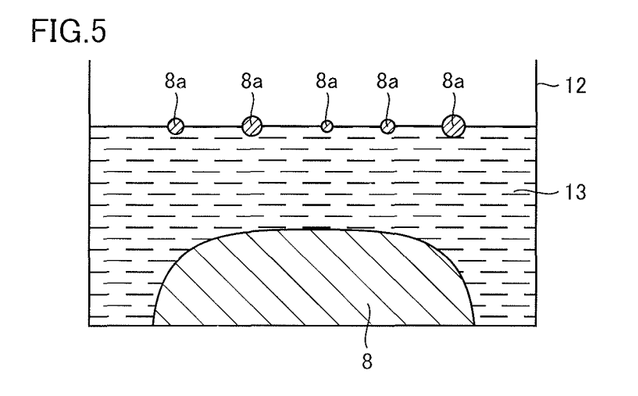
FIG. 5 is a schematic cross sectional view schematically showing one step of the method of manufacturing the silicon carbide substrate in accordance with the embodiment of the present invention.

Next, silicon carbide source material 8 is cleaned using aqua regia (a liquid obtained by mixing the hydrochloric acid having a concentration of 35% with sulfuric acid having a concentration of 60% at a volume ratio of 3:1). Then, silicon carbide source material 8 is cleaned using pure water. Preferably, silicon carbide source material 8 is cleaned for a plurality of times using the hydrochloric acid, the aqua regia, and the pure water. Preferably, the cleaning is repeated until fine powder 8a having a size visible to the eye ceases to exist. As described above, silicon carbide source material 8 is immersed in the acid liquid such as hydrochloric acid and aqua regia, thereby removing fine powder 8a made of silicon carbide and floating on the surface of the liquid. Then, silicon carbide source material 8 is taken out of beaker 12 and is dried.

Figure 1:
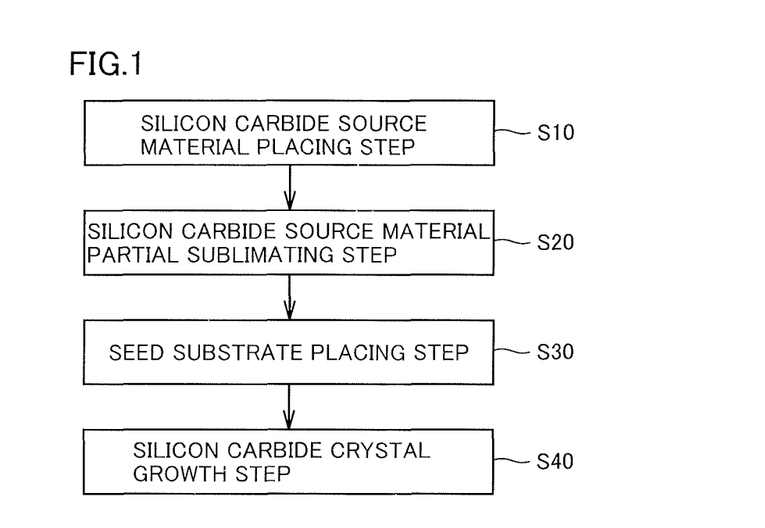
FIG. 1 is a flowchart schematically showing a method of manufacturing a silicon carbide substrate in accordance with an embodiment of the present invention.
Figure 2:
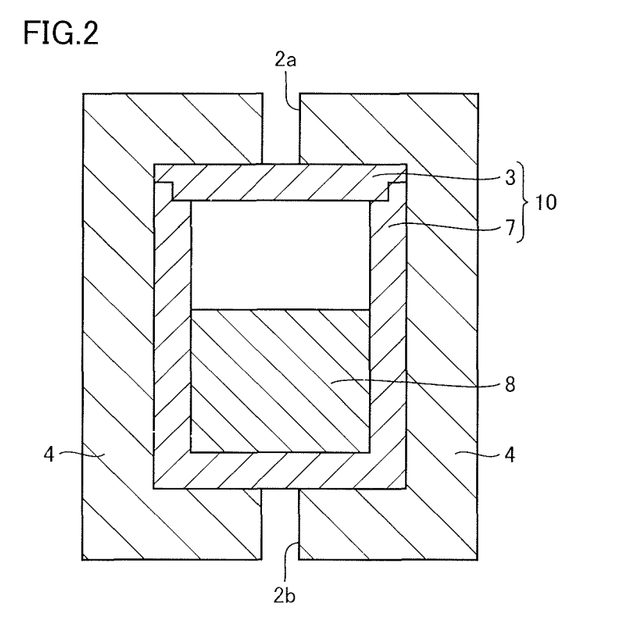
FIG. 2 is a schematic cross sectional view schematically showing a first step of the method of manufacturing the silicon carbide substrate in accordance with the embodiment of the present invention.

Next, a silicon carbide source material placing step (S10 FIG. 1) is performed. Referring to FIG. 2, in the silicon carbide source material placing step, silicon carbide source material 8 is accommodated in source material accommodating portion 7 of growth container 10. It is preferable to use a silicon carbide source material from which the fine powder made of silicon carbide has been removed through the cleaning step.

Next, a silicon carbide source material partial sublimating step (S20: FIG. 1) is performed. Specifically, referring to FIG. 2, growth container 10 having silicon carbide source material 8 placed therein is placed in a high-frequency heating furnace. After evacuating the high-frequency heating furnace, a pressure is maintained at, for example, 800 kPa while introducing an inert gas such as argon gas. While maintaining the pressure at, for example, 800 kPa, the temperature of the lower portion of growth container 10 (i.e. the bottom portion of source material accommodating portion 7) is set at, for example, 2400° C. and the temperature of the upper portion of growth container 10 (i.e., seed substrate retaining portion 3) is set at 2200° C., for example. Then, the pressure of the high-frequency heating furnace is reduced to, for example, 4 kPa and is retained for about 24 hours. In this way, the fine powder in silicon carbide source material 8 and the damaged layer of silicon carbide source material 8 are sublimated preferentially. Then, the pressure in the high-frequency heating furnace is brought back to, for example, 800 kPa, and growth container 10 is thereafter cooled to a room temperature. It should be noted that in the silicon carbide source material partial sublimating step, seed substrate 1 is not placed in seed substrate retaining portion 3 of growth container 10.

It should be noted that when observing seed substrate retaining portion 3 after the silicon carbide source material partial sublimation step, a multiplicity of silicon carbide crystal nuclei each having a size of several millimeters are interspersed in seed substrate retaining portion 3. In other words, if the silicon carbide source material is partially sublimated with seed substrate 1 being retained by seed substrate retaining portion 3, the crystal nuclei are adhered to seed substrate 1. Therefore, in the silicon carbide source material partial sublimating step, it is preferable not to place the seed substrate.

Moreover, silicon carbide source material 8 remaining in source material accommodating portion 7 after the silicon carbide source material partial sublimating step is entirely merged into a pumice-like form (in the form of a porous sintered body). If silicon carbide source material 8 in the form of sintered body is subjected to a mechanical process such as pulverization, fine powder is generated again. Hence, after partially sublimating silicon carbide source material 8, it is preferable to perform silicon carbide crystal growth described below without providing a mechanical process to the remainder of silicon carbide source material 8.

Moreover, the silicon carbide source material partial sublimating step may be performed in vacuum and may be performed involving an impurity having no adverse effect on the silicon carbide single crystal growth. For example, by including hydrogen or halogen in the atmospheric gas, fine powder 8a may be facilitated to become non-existent. Since hydrogen and halogen function as an etching gas, fine powder 8a is facilitated to become non-existent due to chemical etching in addition to the sublimation of the silicon carbide source material.

Next, the seed substrate placing step (S30: FIG. 1) is performed. Specifically, referring to FIG. 3, seed substrate retaining portion 3 of growth container 10 used in the silicon carbide source material partial sublimating step is replaced with another seed substrate retaining portion 3 having seed substrate 1 placed thereon. As described above, after partially sublimating silicon carbide source material 8, seed substrate 1 having main surface 1A is placed in growth container 10.

Figure 4:
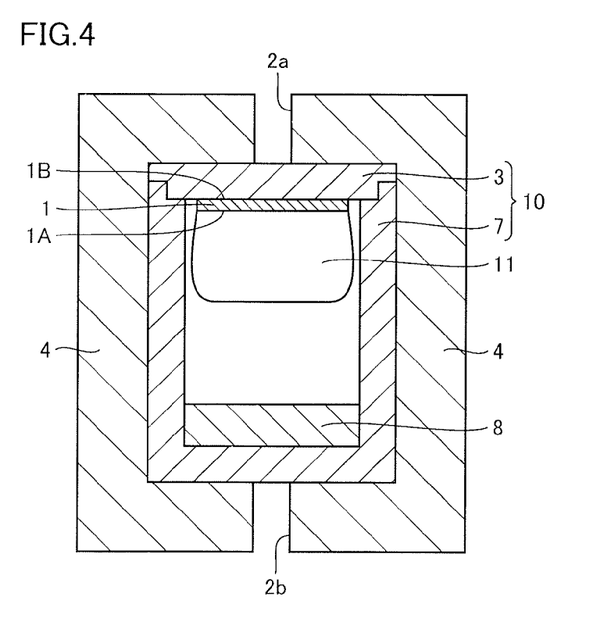
FIG. 4 is a schematic cross sectional view schematically showing a third step of the method of manufacturing the silicon carbide substrate in accordance with the embodiment of the present invention.

Next, the silicon carbide crystal growth step (S40: FIG. 1) is performed. Specifically, referring to FIG. 3, growth container 10 having seed substrate 1 and silicon carbide source material 8 placed therein is placed in the high-frequency heating furnace again. Then, the high-frequency heating furnace is evacuated and the pressure is maintained at, for example, 800 kPa while introducing a mixed gas of argon gas and nitrogen gas (1%). While maintaining the pressure at, for example, 800 kPa, the temperature of the lower portion of growth container 10 (i.e., the bottom portion of source material accommodating portion 7) is set at, for example, 2400° C. and the temperature of the upper portion of growth container 10 (i.e., seed substrate retaining portion 3) is set at 2200° C., for example. Then, the pressure is reduced for 1 hour until the pressure in the high-frequency heating furnace becomes, for example, 2 kPa. Referring to FIG. 4, silicon carbide source material 8 is sublimated and is recrystallized on main surface 1A of seed substrate 1, whereby silicon carbide single crystal 11 grows on main surface 1A of seed substrate 1. After growing silicon carbide single crystal 11 for, for example, 100 hours, the pressure in the high-frequency heating furnace is set at, for example, 800 kPa again. Then, the temperature of growth container 10 is brought back to the room temperature. By sublimating the remainder of silicon carbide source material 8 as described above, silicon carbide single crystal 11 is grown on main surface 1A of seed substrate 1.

It is preferable that after partially sublimating the silicon carbide source material, silicon carbide single crystal 11 is grown without providing a mechanical process to the remainder of the silicon carbide source material. For example, when the silicon carbide source material is subjected to a mechanical process such as pulverization, fine powder is generated in the silicon carbide source material. Preferably, no impact is given to silicon carbide source material 8 after partially sublimating silicon carbide source material 8 and before growing silicon carbide single crystal 11.

Next, silicon carbide single crystal 11 is taken out of growth container 10. Then, silicon carbide single crystal 11 is sliced using, for example, a wire saw, thereby obtaining a silicon carbide substrate.

It should be noted that, in the present embodiment, the method of partially sublimating silicon carbide source material 8 in growth container 10 has been illustrated, but the present invention is not limited to this method. For example, silicon carbide source material 8 may be partially sublimated in a container different from growth container 10, the remaining silicon carbide source material 8 may be subjected to no mechanical process, the remaining silicon carbide source material 8 may be moved to growth container 10, and then the remaining silicon carbide source material 8 may be sublimated, thereby growing silicon carbide single crystal 11 on main surface 1A of seed substrate 1.

The following describes function and effect of the method of manufacturing the silicon carbide substrate in accordance with the present embodiment.

According to the method of manufacturing the silicon carbide substrate in accordance with the present embodiment, silicon carbide source material 8 is partially sublimated and then the remainder of silicon carbide source material 8 is sublimated, thereby growing silicon carbide single crystal 11 on main surface 1A of seed substrate 1. In this way, silicon carbide single crystal 11 can be grown on main surface 1A of seed substrate 1 after sublimating and removing preferentially the fine powder or damaged layer, which would have caused an increase of dislocations at the initial stage of the crystal growth. Moreover, since seed substrate 1 is placed in growth container 10 after partially sublimating silicon carbide source material 8, seed substrate 1 can be prevented from being contaminated by the sublimated fine powder and damaged layer. As a result, a silicon carbide substrate having few dislocations can be obtained.

Moreover, according to the method of manufacturing the silicon carbide substrate in accordance with the present embodiment, the step of growing silicon carbide single crystal 11 is performed without providing a mechanical process to the remainder of silicon carbide source material 8, after the step of partially sublimating silicon carbide source material 8. In this way, the fine powder and the damaged layer can be prevented from being generated in the remainder of silicon carbide source material 8.

Further, according to the method of manufacturing the silicon carbide substrate in accordance with the present embodiment, a value obtained by subtracting a second dislocation density just below main surface 1A of seed substrate 1 from a first dislocation density just above main surface 1A of seed substrate 1 is not more than $1 \times 10^3$ cm$^{-2}$. In this way, a silicon carbide substrate having few dislocations can be effectively obtained.

Moreover, the method of manufacturing the silicon carbide substrate in accordance with the present embodiment further includes the step of reducing a silicon carbide fine powder 8a in silicon carbide source material 8 before partially sublimating silicon carbide source material 8. In this way, a silicon carbide substrate having few dislocations can be more effectively obtained.

Further, according to the method of manufacturing the silicon carbide substrate in accordance with the present embodiment, the step of reducing silicon carbide fine powder 8a is performed by immersing silicon carbide source material 8 in hydrochloric acid and aqua regia and removing silicon carbide fine powder 8a floating on a surface of the hydrochloric acid and aqua regia. In this way, with such a simple method, silicon carbide fine powder 8a can be removed from silicon carbide source material 8.

EXAMPLE

In the present example, silicon carbide single crystals were grown using three types of methods illustrated below so as to examine a rate of increase in the dislocation density in main surface 1A of each seed substrate 1. The silicon carbide crystals of the present invention's example, a comparative example 1, and a comparative example 2 were fabricated using the same method as the method described in the embodiment except differences described below. The method of manufacturing silicon carbide single crystal 11 in comparative example 1 was different from the manufacturing method of the present invention's example in that a commercially available silicon carbide source material 8 was used without any modification and the method in comparative example 1 did not include the silicon carbide source material partial sublimating step and did not include the step of removing the fine powder through acid cleaning before the sublimation, and the method of manufacturing silicon carbide single crystal 11 in comparative example 1 is the same as the manufacturing method of the present invention's example in the other points. The method of manufacturing silicon carbide single crystal 11 in comparative example 2 was different from the manufacturing method of the present invention's example in that the method of manufacturing silicon carbide single crystal 11 in comparative example 2 did not include the silicon carbide source material partial sublimating step, and was the same as the manufacturing method of the present invention's example in the other points.

Figure 6:
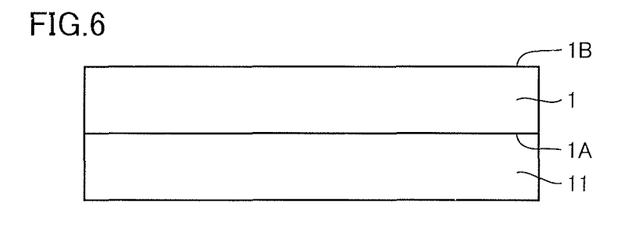
FIG. 6 illustrates a method of measuring an amount of increase of dislocations in a main surface of a seed substrate.
Figure 7:
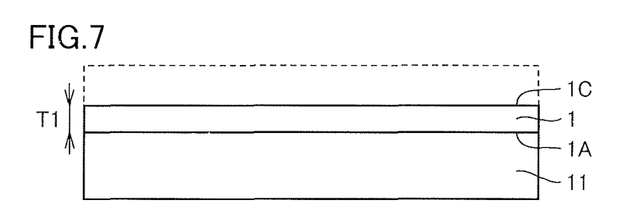
FIG. 7 illustrates the method of measuring the amount of increase of dislocations in the main surface of the seed substrate.

The following describes a method of determining a rate of increase in the dislocation density in main surface 1A of seed substrate 1. First, referring to FIG. 6, silicon carbide single crystal 11 grown on main surface 1A of seed substrate 1 was taken out and was sliced along a plane parallel to main surface 1A of seed substrate 1, thereby preparing a substrate having seed substrate 1 and silicon carbide single crystal 11. Next, referring to FIG. 7, the substrate was started to be polished from the silicon plane 1B side so as to polish seed substrate 1 such that the thickness of seed substrate 1 from main surface 1A (i.e., growth interface) became thickness T1. Thickness T1 of the remaining seed substrate 1 was about 100 μm. A threading dislocation density in surface 1C of seed substrate 1 was evaluated using KOH (potassium hydroxide) etching.

Figure 8:
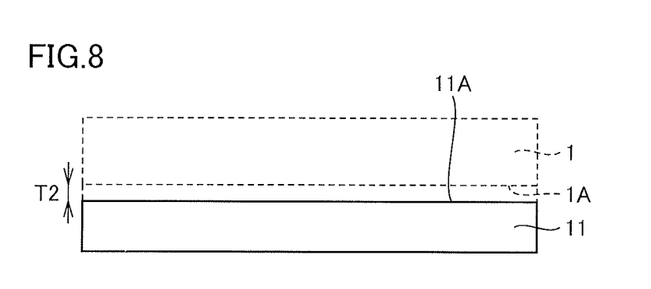
FIG. 8 illustrates the method of measuring the amount of increase of dislocations in the main surface of the seed substrate.

Thereafter, referring to FIG. 8, the substrate was further polished to polish the whole of seed substrate 1, and then silicon carbide single crystal 11 was polished only by a thickness T2. Thickness T2 by which silicon carbide single crystal 11 was polished was about 100 µm. Accordingly, there was obtained silicon carbide single crystal 11 having surface 11A exposed. A threading dislocation density in surface 11A of silicon carbide single crystal 11 was evaluated using KOH etching.

The threading dislocation density was measured at 177 locations in surface 1C and surface 11A (at a pitch of 10 mm). Each measurement area was 2 mm×2 mm. The rate of increase in the threading dislocation density was represented by a value obtained by subtracting the threading dislocation density (second dislocation density) in surface 1C of seed substrate 1 (i.e., just below main surface 1A) from the threading dislocation density (first dislocation density) in surface 11A of silicon carbide single crystal 11 (i.e., just above main surface 1A). It should be noted that a positioning marking was provided through laser processing for the purpose of measurement at corresponding positions just above and just below the main surface in the direction perpendicular to main surface 1A.

TABLE 1

|  | Source Material Partial Sublimation before Crystal Growth | Acid Cleaning | Rate of Increase in Threading Dislocation Density |
|---|---|---|---|
| The Present Invention's Example | Performed | Performed | $1 \times 10^3$ cm$^{-2}$ or less |
| Comparative Example 1 | Not Performed | Performed | $3.7 \times 10^3$ cm$^{-2}$ |
| Comparative Example 2 | Not Performed | Not Performed | $8.5 \times 10^4$ cm$^{-2}$ |

Referring to Table 1, the following describes a result regarding the rate of increase in the threading dislocation density. The rate of increase in the threading dislocation density in the present invention's example was +30 cm$^{-2}$ (+3 in the measurement area) at maximum and was −175 cm$^{-2}$ at minimum (−7 in the measurement area), and the average was −30 cm$^{-2}$ (−1.2 in the measurement area). Here, "+" indicates that the threading dislocation density was increased and "−" indicates that the threading dislocation density was decreased. In addition, although it is difficult to evaluate the increase/decrease in the dislocation density precisely because there are possibilities of movement of dislocation positions and displacement of positions just above and just below the main surface in the direction perpendicular to main surface 1A, the rate of increase in the threading dislocation density in the present invention's example was at least $1 \times 10^3$ cm$^{-2}$ or less. It should be noted that in the present invention's example, the threading dislocation density was slightly reduced. This is presumably because dislocations having opposite Burgers vectors were merged with each other at the early stage of the growth and accordingly ceased to exist. Further, the rate of increase in the threading dislocation density in comparative example 1 was about $3.7 \times 10^3$ cm$^{-2}$, and the rate of increase in the threading dislocation density in comparative example 2 was about $8.5 \times 10^4$ cm$^{-2}$.

From the result above, it was confirmed that a silicon carbide crystal having a low dislocation density is obtained by partially sublimating the silicon carbide source material before the crystal growth of silicon carbide. Moreover, it was confirmed that the silicon carbide crystal having a smaller dislocation density can be obtained by removing silicon carbide fine particles through the acid cleaning for the silicon carbide source material before partially sublimating the silicon carbide source material.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: seed substrate; 1A: main surface; 1B: silicon plane; 1C: surface; 2a, 2b: through hole; 3: seed substrate retaining portion; 4: heat insulator; 7: source material accommodating portion; 8: silicon carbide source material; 8a: fine particle; 10: growth container; 11: silicon carbide single crystal; 11A: surface; 12: beaker; 13: liquid.

The invention claimed is:

1. A method of manufacturing a silicon carbide substrate, comprising the steps of:
   partially sublimating a silicon carbide source material;
   placing a seed substrate having a main surface in a growth container after the step of partially sublimating said silicon carbide source material; and
   growing a silicon carbide crystal on said main surface of said seed substrate by sublimating a remainder of said silicon carbide source material in said growth container.

2. The method of manufacturing a silicon carbide substrate according to claim 1, wherein
   the step of growing said silicon carbide crystal is performed without providing a mechanical process to the remainder of said silicon carbide source material, after the step of partially sublimating said silicon carbide source material.

3. The method of manufacturing a silicon carbide substrate according to claim 1, wherein
   a value obtained by subtracting a second dislocation density just below said main surface of said seed substrate from a first dislocation density just above said main surface of said seed substrate is not more than $1 \times 10^3$ cm$^{-2}$.

4. The method of manufacturing a silicon carbide substrate according to claim 1, further comprising the step of reducing a silicon carbide fine powder in said silicon carbide source material before partially sublimating said silicon carbide source material.

5. The method of manufacturing a silicon carbide substrate according to claim 4, wherein
   the step of reducing said silicon carbide fine powder is performed by immersing said silicon carbide source material in a liquid and removing said silicon carbide fine powder floating on a surface of said liquid.

* * * * *